(12) United States Patent
Cheng et al.

(10) Patent No.: US 9,905,663 B2
(45) Date of Patent: Feb. 27, 2018

(54) FABRICATION OF A VERTICAL FIN FIELD EFFECT TRANSISTOR WITH A REDUCED CONTACT RESISTANCE

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/191,566

(22) Filed: Jun. 24, 2016

(65) Prior Publication Data

US 2017/0373159 A1   Dec. 28, 2017

(51) Int. Cl.
| | |
|---|---|
| *H01L 21/8234* | (2006.01) |
| *H01L 21/84* | (2006.01) |
| *H01L 29/417* | (2006.01) |
| *H01L 29/66* | (2006.01) |
| *H01L 29/78* | (2006.01) |
| *H01L 29/10* | (2006.01) |
| *H01L 21/265* | (2006.01) |

(52) U.S. Cl.
CPC .. *H01L 29/41791* (2013.01); *H01L 21/26513* (2013.01); *H01L 21/823431* (2013.01); *H01L 21/845* (2013.01); *H01L 29/1041* (2013.01); *H01L 29/6656* (2013.01); *H01L 29/66666* (2013.01); *H01L 29/66795* (2013.01); *H01L 29/785* (2013.01); *H01L 29/7827* (2013.01); *H01L 2029/7858* (2013.01)

(58) Field of Classification Search
CPC ........... H01L 29/41791; H01L 29/6656; H01L 29/66666; H01L 29/66712; H01L 29/7827; H01L 29/785; H01L 29/1041; H01L 29/66795; H01L 29/7831; H01L 21/26513; H01L 21/823431; H01L 21/845; H01L 2029/7858; H01L 27/10826; H01L 27/10879
See application file for complete search history.

(56) References Cited

U.S. PATENT DOCUMENTS

| | | |
|---|---|---|
| 6,660,590 B2 | 12/2003 | Yoo |
| 6,846,709 B1 | 1/2005 | Lojek |
| 7,033,877 B2 | 4/2006 | Chaudhry et al. |
| (Continued) | | |

OTHER PUBLICATIONS

Office Action dated Oct. 23, 2017 from corresponding U.S. Appl. No. 15/611,388, pp. 1-26.

*Primary Examiner* — Galina Yushina
(74) *Attorney, Agent, or Firm* — Tutunjian & Bitetto, P.C.; Vazken Alexanian

(57) ABSTRACT

A method of forming a vertical fin field effect transistor (vertical finFET) with an increased surface area between a source/drain contact and a doped region, including forming a doped region on a substrate, forming one or more interfacial features on the doped region, and forming a source/drain contact on at least a portion of the doped region, wherein the one or more interfacial features increases the surface area of the interface between the source/drain contact and the doped region compared to a flat source/drain contact-doped region interface.

8 Claims, 10 Drawing Sheets

(56) References Cited

U.S. PATENT DOCUMENTS

| | | |
|---|---|---|
| 7,898,041 B2 | 3/2011 | Radosavljevic et al. |
| 8,466,511 B2 | 6/2013 | Oh et al. |
| 8,847,298 B2 | 9/2014 | Thomas |
| 8,883,585 B1 | 11/2014 | Fumitake |
| 9,299,835 B1 | 3/2016 | Anderson et al. |
| 9,530,700 B1* | 12/2016 | Mallela ............... H01L 27/0924 |
| 2007/0045735 A1 | 3/2007 | Orlowski et al. |
| 2011/0147815 A1* | 6/2011 | Takeda ................ H01L 29/0847 257/288 |
| 2011/0147840 A1 | 6/2011 | Cea et al. |
| 2012/0132966 A1 | 5/2012 | Doris et al. |
| 2013/0285155 A1 | 10/2013 | Glass et al. |
| 2014/0374845 A1* | 12/2014 | Masuoka ............ H01L 29/4238 257/413 |
| 2015/0255640 A1 | 9/2015 | Yang et al. |
| 2016/0093740 A1* | 3/2016 | Harley ................ H01L 29/7851 257/347 |
| 2016/0293756 A1 | 10/2016 | Liu et al. |

* cited by examiner

FABRICATION OF A VERTICAL FIN FIELD EFFECT TRANSISTOR WITH A REDUCED CONTACT RESISTANCE

BACKGROUND

Technical Field

The present invention generally relates to a vertical fin field effect transistor (vertical finFET) structure with reduced contact resistance, and more particularly to a vertical finFET with reduced contact resistance between bottom source/drains and conductive source drain contacts.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. A vertical finFET can also be configured with a bottom source/drain in the substrate and a top source/drain on the vertical fin, where the current then flows in a direction perpendicular to the substrate. The channel for the finFET can typically be an upright slab of thin rectangular Si, commonly referred to as the fin with a gate on the fin, as compared to a MOSFET with a gate on the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present principles, a method is provided for forming a vertical fin field effect transistor (vertical finFET) with an increased surface area between a source/drain contact and a doped region. The method includes the step of forming a doped region on a substrate. The method further includes the steps of forming one or more interfacial features on the doped region, and forming a source/drain contact on at least a portion of the doped region, wherein the one or more interfacial features increases the surface area of the interface between the source/drain contact and the doped region compared to a flat source/drain contact-doped region interface.

In accordance with an embodiment of the present principles, a method is provided for forming a vertical fin field effect transistor (vertical finFET) with a reduced source/drain contact resistance. The method includes the steps of forming one or more doped regions in a substrate, and forming a plurality of vertical fins on at least one of the one or more doped regions. The method further includes the step of heat treating the one or more doped regions in the substrate and the plurality of vertical fins on the at least one of the one or more doped regions to diffuse dopant from the doped region in contact with the plurality of vertical fins into a lower portion of the plurality of vertical fins. The method further includes the steps of removing at least one of the plurality of vertical fins, wherein the lower portion of the at least one of the plurality of vertical fins remains as an extension on the at least one of the one or more doped regions, and forming a bottom source/drain contact on the extension and the at least one of the one or more doped regions.

In accordance with another embodiment of the present principles, a vertical fin field effect transistor device with an increased surface area between a bottom source/drain contact and a doped region is provided. The device includes a doped region formed on a substrate. The device further includes a bottom source/drain contact formed on at least a portion of the doped region, wherein the doped region has one or more interfacial features that increases the surface area of the interface between the bottom source/drain contact and the doped region compared to a flat bottom source/drain contact-doped region interface.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
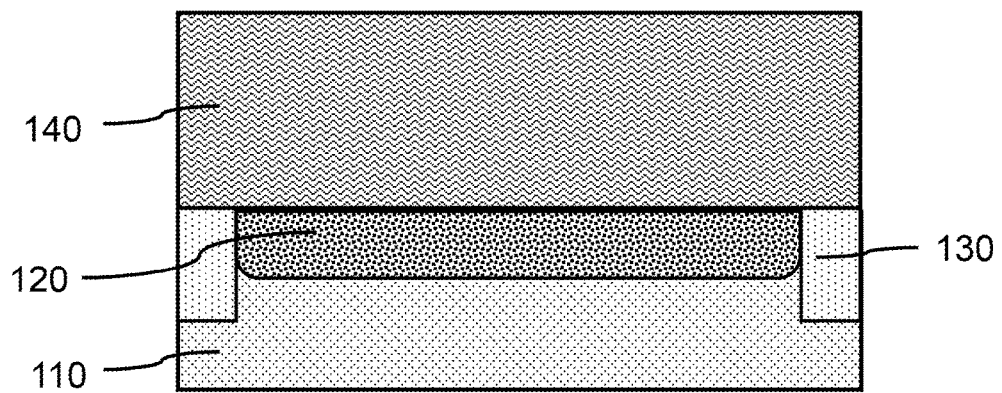
FIG. 1 is a cross-sectional side view of a substrate with a doped region and isolation regions formed in the substrate, in accordance with an exemplary embodiment.

Principles and embodiments of the present disclosure relate generally to fabricating a source/drain contact having an increased contact surface area with a source/drain. The surface area may be increased relative to a flat source/drain contact-to-source/drain by fabricating extensions or recesses that introduce surface features providing additional contact area for the conductive source/drain contact.

Principles and embodiments of the present disclosure relate generally to reducing the contact resistance between a source/drain contact and a source/drain by increasing the interfacial area between the source/drain contact and the source/drain. In particular, reducing the contact resistance between a source/drain contact and a bottom source/drain formed in a substrate for a vertical fin field effect transistor, where the current flows vertically to or from the bottom source/drain. In various embodiments, the source and drain may be reversed, so the source is on top of a vertical fin and the drain is below the vertical fin. Reducing the contact resistance can provide increased device performance, particularly as the device component sizes and surface areas continue to decrease, for example, to and below the 5 nm node.

Principles and embodiments of the present disclosure relate generally to modifying the configuration of the interface between a source/drain contact and a source/drain to have additional 3-dimensional interfacial features. In various embodiments, one or more vertical fins may be partially removed to form one or more extensions jutting out from the source/drain surface, where each extension has sidewalls and endwalls that provide additional interfacial area with a source/drain contact compared to a flat surface of a source/drain. In various embodiments, one or more vertical fins may be completely removed and portions of the source/drain also removed to form one or more recesses into the source/drain surface, where each recess has sidewalls and endwalls that provide additional interfacial area with a source/drain contact compared to a flat surface of a source/drain. The source/drain contact may wrap around the extension(s) or extend into the recess(es), and thereby increase the contact surface area for an electrical connection.

Exemplary applications/uses to which the present principles can be applied include, but are not limited to: formation of vertical finFETs, complementary metal oxide silicon (CMOS) field effect transistors (FETs) formed by coupled finFETs, and digital gate devices (e.g., NAND, NOR, XOR, etc.).

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, is a cross-sectional side view of a substrate with a doped region and isolation regions formed in the substrate, in accordance with an exemplary embodiment.

In one or more embodiments, a substrate 110 may be a semiconductor or an insulator with an active surface semiconductor layer. The substrate may be crystalline, semi-crystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including but not limited to high-k oxides and/or nitrides. In one or more embodiments, the substrate 110 may be a silicon wafer. In various embodiments, the substrate may be a single crystal silicon (Si), silicon germanium (SiGe), II-VI semiconductor (e.g., ZnTe, CdZnTe), or III-V semiconductor (e.g., GaAs) wafer, or have a single crystal silicon (Si), silicon germanium (SiGe), II-VI semiconductor (e.g., ZnTe, CdZnTe), or III-V semiconductor (e.g., GaAs) surface/active layer.

In one or more embodiments, a doped region 120 may be formed at the surface of the substrate 110, where the doped region may form a bottom source/drain for a field effect transistor (FET) device. The doped region 120 may be formed in-situ, for example, during epitaxial growth of an active semiconductor layer on a crystalline surface of the substrate 110, or ex-situ, for example, through ion implantation or thermal diffusion of dopants into the substrate to a predetermined depth. Other suitable doping techniques may also be used, including but not limited to, gas phase doping, plasma doping, plasma immersion ion implantation, cluster doping, infusion doping, liquid phase doping, solid phase doping, or combinations thereof. In various embodiments, the doped region 120 (i.e., source/drain region) may be n-doped or p-doped. The doped region 120 may form a bottom source/drain of a vertical fin field effect transistor (vertical finFET). In various embodiments, a plurality of vertical fins may be electrically coupled to the same bottom source/drain to form a multi-fin vertical FET. The vertical fin(s) and bottom source/drain(s) may be suitably doped to form an NFET or a PFET. In an exemplary embodiments, the doped region 120 may include an n-type or p-type dopant in a silicon (Si) or silicon germanium surface region/layer of the substrate 110. In various embodiments, the n-type dopants may include phosphorus (P), arsenic (As) and antimony (Sb), and p-type dopants include boron (B), gallium (Ga), and indium (In). The dopant concentrations may be in the range of about $1 \times 10^{19}$ cm$^{-3}$ to about $2 \times 10^{21}$ cm$^{-3}$, although lower or higher dopant concentration are also contemplated.

In one or more embodiments, one or more isolation regions 130 may be formed in the substrate 110, where the isolation regions may separate and electrically isolate doped regions 120 to form separate bottom source/drain regions for individual vertical finFET devices. The isolation regions 130 may be formed by removing a portion of the substrate to a depth below the depth of the doped region 120 to form a trench in the substrate, where the portion of the substrate may be removed by anisotropic etching, for example, a selective reactive ion etch (RIE). The trench may be filled with an insulator material, for example, silicon oxide (SiO), silicon nitride (SiN), silicon oxynitride (SiON), or other similar insulating materials, as well as combinations of the materials, as would be known in the art.

In one or more embodiments, a fin layer 140 may be formed on the substrate surface, where the fin layer 140 may be epitaxially grown on a crystalline substrate. The fin layer 140 may be formed over one or more doped regions 120, such that the doped region may be a bottom source/drain for one or more vertical fins formed on the doped region 120.

In one or more embodiments, the fin layer 140 may include silicon (Si), germanium (Ge), silicon germanium (SiGe), silicon carbide (SiC), carbon-doped silicon, III-V compound semiconductor (e.g., GaAs), or a II-VI compound semiconductor (e.g., ZnSe, CdZnTe).

Figure 2:
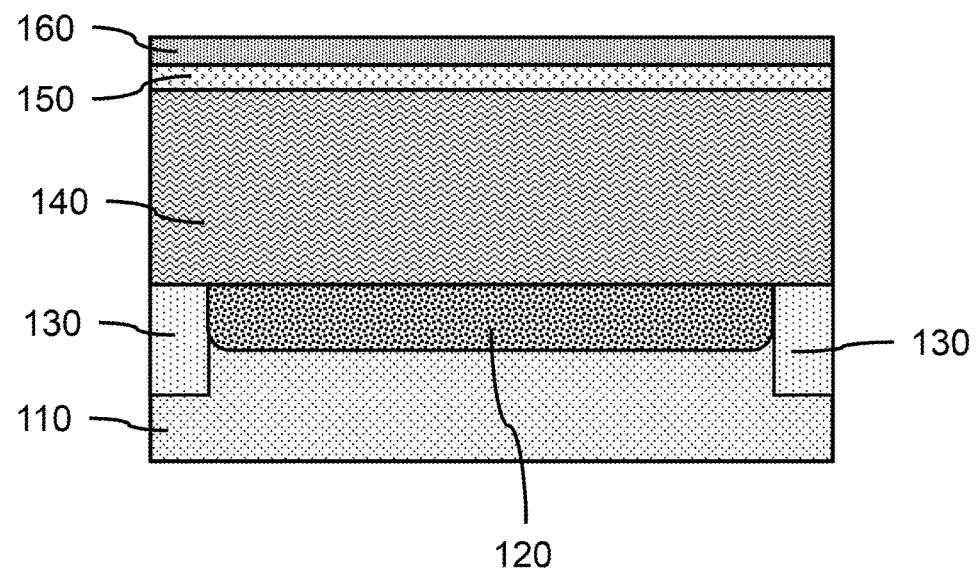
FIG. 2 is a cross-sectional side view of a hardmask layer and a liner layer on a fin layer, in accordance with an exemplary embodiment.

FIG. 2 is a cross-sectional side view of a hardmask layer and a liner layer on a fin layer, in accordance with an exemplary embodiment;

In one or more embodiments, a liner layer 150 may be formed on at least a portion of a fin layer 140, and a hardmask layer 160 may be formed on at least a portion of the liner layer 150. A masking layer (e.g., a resist) may be formed on the hardmask layer 160 and patterned, as would be known in the art.

In one or more embodiments, a liner layer 150 may be an oxide, for example, silicon oxide (SiO), silicon oxynitride (SiON), or a combination thereof. The liner layer 150 may be deposited or formed by a thermal process, such as, for example, oxidation and/or nitridation of the top portion of the fin layer 140. The liner layer 150 may protect the underlying material from having defects introduced by formation of a hardmask layer 160. The liner layer 150 may be a material different than the hardmask layer 160, where the liner layer may act as an etch stop layer.

In one or more embodiments, a hardmask layer 160 may be formed on an exposed surface of the liner layer 150. In various embodiments, the hardmask layer 160 may be formed directly on the fin layer without an intervening liner layer. In various embodiments, the hardmask layer 160 may be an oxide, for example, silicon oxide (SiO), a nitride, for example, a silicon nitride (SiN), an oxynitride, for example, silicon oxynitride (SiON), or a carbon-oxide, for example, silicon carbo-oxide (SiCO), or a combination thereof. In various embodiments, the hardmask layer 160 may be silicon nitride (SiN), for example, $Si_3N_4$.

In one or more embodiments, the hardmask layer 160 may have a thickness in the range of about 20 nm to about 100 nm, or in the range of about 35 nm to about 75 nm, or in the range of about 45 nm to about 55 nm, although other thicknesses are contemplated.

Figure 3:
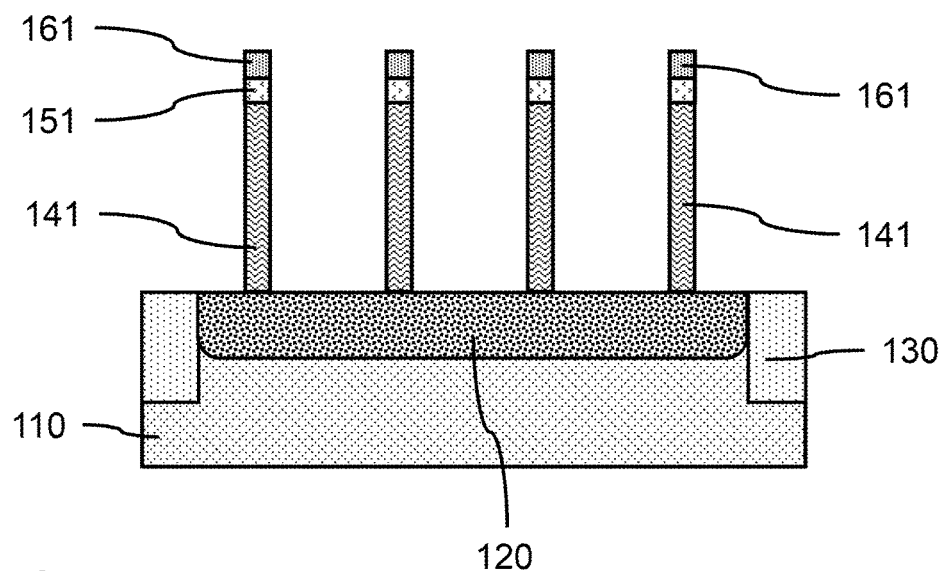
FIG. 3 is a cross-sectional side view of hardmask segments patterned on liner segments on a plurality of vertical fins formed from the fin layer, in accordance with an exemplary embodiment.

FIG. 3 is a cross-sectional side view of a hardmask segments patterned on liner segments on a plurality of vertical fins formed from the fin layer, in accordance with an exemplary embodiment.

A masking layer may be formed and patterned to form photo masks on the exposed surface of the hardmask layer 160. The masking layer may be a temporary resist (e.g., poly methyl methacrylate (PMMA)) that may be deposited on the hardmask layer, patterned, and developed to expose portions of the hardmask layer. The photo mask layer may be a positive resist or a negative resist.

In one or more embodiments, the hardmask layer 160 may be etched to form one or more hardmask section(s) 161, where the photo masks define the width, length, and location of the hardmask sections(s) 161 on the fin layer or liner layer. In various embodiments, the liner layer 150 may act as an etch stop. The liner layer 150 may be etched to form a liner section 151 below each hardmask section 161.

In one or more embodiments, portions of the hardmask layer 160, liner layer 150, and fin layer 140 may be removed to form one or more vertical fin(s) 141 on a doped region 120, with a liner section 151 and a hardmask section 161 on each of the one or more vertical fins 141. In various embodiments, the hardmask layer, liner layer, and fin layer may be patterned and etched using a lithography process for the masking layer and an RIE process for the hardmask layer 160 and liner layer 150. During vertical fin formation, the liner section 151 and a hardmask section 161, along with the underlying fin layer 140 can be patterned and etched together.

In one or more embodiments, one or more vertical fin(s) 141 may be formed by a sidewall image transfer (SIT) process, in which sacrificial mandrels may be formed on the substrate 110, and spacers may be formed on the sidewalls of the sacrificial mandrels, as would be known in the art. The sacrificial mandrels may be removed, and the spacers used as masks for patterning the underlying fin layer 140. The liner layer and hardmask layer may be deposited on the fin layer 140 before fin patterning, and the liner layer and/or a hardmask layer may be patterned and etched together with the vertical fin(s). The liner section 151 and a hardmask section 161 may remain on the vertical fin(s) 141 after patterning and removal of the substrate material.

In one or more embodiments, a portion of the fin layer 140 may be removed to form one or more vertical fin(s) 141 on the substrate 110, where the one or more vertical fin(s) 141 may be on a doped region 120 on the substrate 110.

In one or more embodiments, the photo mask(s), liner segment(s) 151, and/or hardmask segment(s) 161 may have a width in the range of about 6 nm to about 20 nm, or may have a width in the range of about 8 nm to about 15 nm, or may have a width in the range of about 10 nm to about 12 nm. The photo mask(s), liner segment(s) 151, and/or hardmask segment(s) 161 may have a length in the range of about 100 nm to about 1000 nm, or in the range of about 100 nm to about 500 nm, or in the range of about 100 nm to about 400 nm, or in the range of about 100 nm to about 200 nm.

In one or more embodiments, the vertical fin(s) 141 may have a width in the range of about 6 nm to about 20 nm, or may have a width in the range of about 8 nm to about 15 nm, or may have a width in the range of about 10 nm to about 12 nm. The vertical fin(s) 141 may have a length in the range of about 100 nm to about 1000 nm, or in the range of about 100 nm to about 500 nm, or in the range of about 100 nm to about 400 nm, or in the range of about 100 nm to about 200 nm.

In various embodiments, there may be a pitch, Pi, between adjacent hardmask segments 141 in the range of about 30 nm to about 200 nm, or in the range of about 30 nm to about 100 nm, or in the range of about 30 nm to about 50 nm, or about 42 nm.

In one or more embodiments, portions of the fin layer 140 may be removed by an isotropic etch or an anisotropic etch. An anisotropic etch may be a directional dry plasma etch that preferentially removes material from exposed surfaces approximately perpendicular to the incident direction of the plasma. The dry plasma etch may be a reactive ion etch (RIE). In one or more embodiments, an RIE may be used to form one or more fin trenches to separate the fin layer into a plurality of vertical fins 141.

In various embodiments, a plurality of vertical fins 141 may be formed on the same doped region 120, where one or more of the plurality of vertical fins 141 may be predetermined to be dummy fins that may be subsequently removed, whereas one or more of the plurality of vertical fins 141, not predetermined to be dummy fins, may be predetermined to be device fins on which a gate structure may subsequently be formed.

Figure 4:
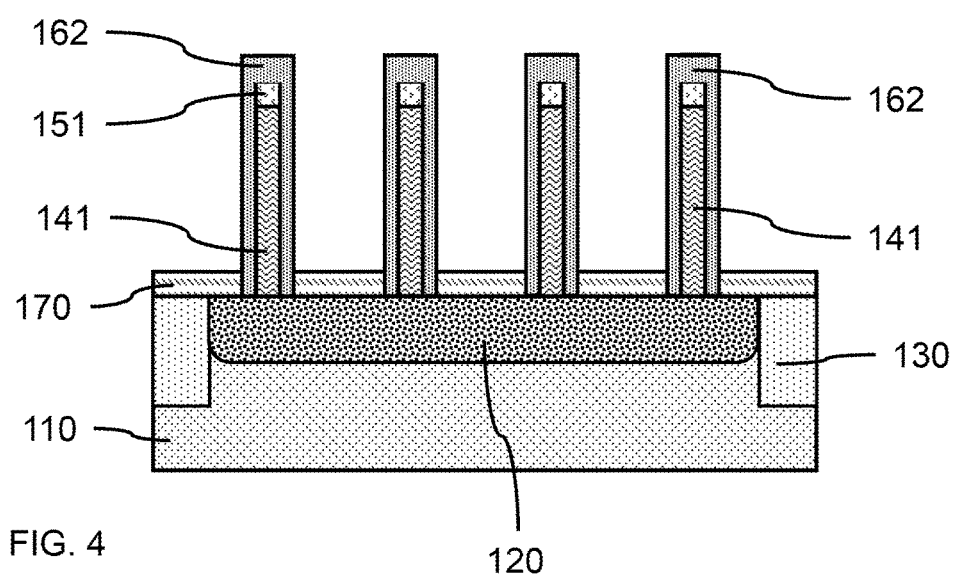
FIG. 4 is a cross-sectional side view of a hardmask cover on each of a plurality of liner segments and vertical fins, in accordance with an exemplary embodiment.

FIG. 4 is a cross-sectional side view of a hardmask cover on each of a plurality of liner segments and vertical fins, in accordance with an exemplary embodiment.

In one or more embodiments, an additional layer of hardmask may be formed on the one or more vertical fin(s) 141, where the additional layer covers at least the side and end walls of each vertical fin 141. A portion of the additional hardmask layer may be removed from the surface of the substrate by a directional etch to form a hardmask cover 162 on each of the vertical fins. The hardmask cover 162 may protect the sidewalls and endwalls of the vertical fins during subsequent processing steps. In various embodiments, the hardmask cover 162 may be optional.

In one or more embodiments, a bottom spacer layer 170 may be formed on the surface of the substrate 110, where the bottom spacer layer may be formed in the region(s) between each vertical fin 141. The bottom spacer layer 170 may surround at least one vertical fin 141. In various embodiments, the bottom spacer layer 170 may be formed by a blanket deposition over the hardmask cover(s) 162 and the substrate surface, and etched back to leave the bottom spacer layer on the substrate. The bottom spacer layer 170 also may be formed by a directional deposition, for example, a gas cluster ion beam (GCIB) deposition process that preferentially forms the bottom spacer layer on the surfaces approximately normal to the direction of the ion beam. Portions of the bottom spacer layer 170 may be removed from the hardmask cover(s) 162 and/or sidewalls of the vertical fin(s) 141, for example, by directional etching to leave a bottom spacer layer on the exposed portions of the substrate surface adjacent to the lower portion(s) of the hardmask cover(s) 162 and vertical fin(s) 141.

In one or more embodiments, a bottom spacer layer may be silicon oxide (SiO), silicon nitride (SiN), silicon oxynitride (SiON), silicon boro-carbonitride (SiBCN), silicon oxy-carbonitride (SiOCN), silicon oxycarbide (SiOC), or a suitable combination thereof.

In one or more embodiments, the bottom spacer layer 170 may have a thickness in the range of about 3 nm to about 25 nm, or in the range of about 5 nm to about 20 nm, although other thicknesses are contemplated. The thickness of the bottom spacer layer 170 may provide electrical isolation of subsequently formed work function layer(s) and/or a conducting gate fill layer from the doped region 120 in the substrate 110.

Figure 5:
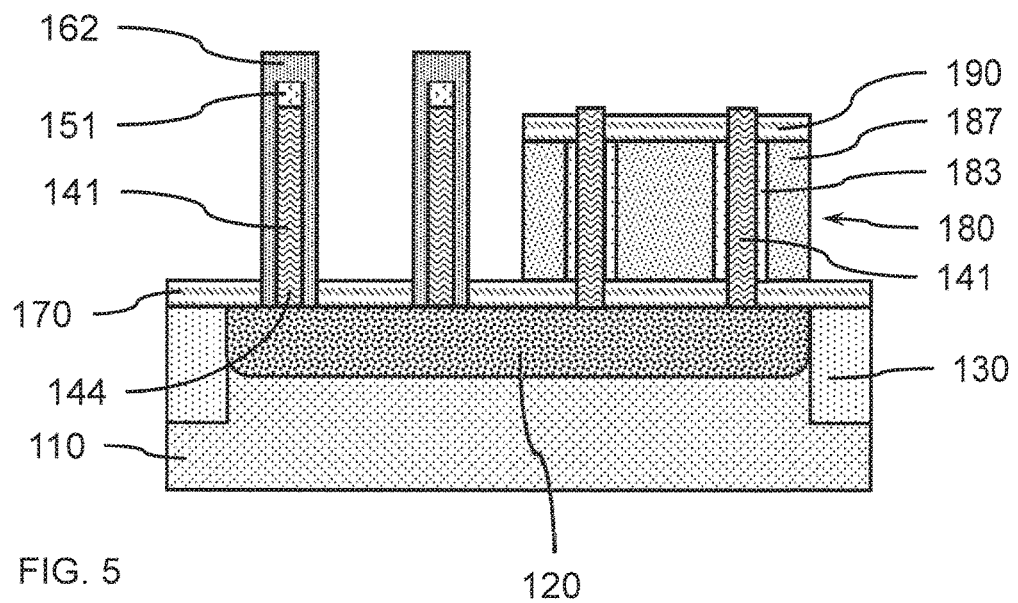
FIG. 5 is a cross-sectional side view of a gate structure formed on a plurality of vertical fins, in accordance with an exemplary embodiment.

FIG. 5 is a cross-sectional side view of a gate structure formed on a plurality of vertical fins, in accordance with an exemplary embodiment.

In one or more embodiments, a gate structure 180 may be formed on at least a portion of a vertical fin 141. A gate structure 180 may include one or more material layers including a dielectric layer and a gate electrode on a vertical fin 141, where the vertical fin forms a channel. In one or more embodiments, a top spacer layer 190 may be formed on the gate structure(s) 180 to electrically isolate the gate structure(s) from a top source/drain 200.

In one or more embodiments, a gate dielectric layer 183 may be formed on at least a portion of a vertical fin 141. The gate dielectric layer 183 may be formed on at least a portion of a bottom spacer 170. In various embodiments, the gate dielectric layer 183 may be an insulating dielectric material, for example, silicon oxide (SiO) or a high-k dielectric material.

In various embodiments, the gate dielectric layer 183 may be a high-K dielectric material that may include, but is not limited to, metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3} Nb_{2/3} O_3$). The high-k material may further include dopants such as lanthanum and/or aluminum. The stoichiometry of the high-k dielectric compounds may vary.

In one or more embodiments, a gate structure may include a gate fill layer 187, In one or more embodiments, a gate fill layer 187 may be formed on the bottom spacer layer 170 and/or first gate dielectric layer 183, where the gate fill layer 187 may be a conductive material that forms part of a gate electrode on a vertical fin 141. In various embodiments, the gate fill layer 187 may be formed on the bottom spacer layer 170 and/or a work function layer. The gate fill layer 187 may be formed by a blanket deposition that fills the spaces between the vertical fins 141, for example, by ALD, CVD, PVD, or a combination thereof. The gate fill layer 187 may extend above the tops surfaces of the vertical fin(s) 141. The portion of gate fill layer 187 above the top surfaces of the vertical fin(s) 141 may be removed, for example, by chemical-mechanical polishing (CMP) and/or etching.

In various embodiments, the conductive gate fill layer 187 may be a metal, where the metal may be tungsten (W), titanium (Ti), molybdenum (Mo), cobalt (Co), or a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO), cobalt silicide (CoSi), nickel silicide (NiSi)), carbon nanotube(s), conductive carbon, graphene, or any suitable combination of these materials. The conductive material may further comprise dopants that are incorporated during or after formation/deposition.

Figure 15:
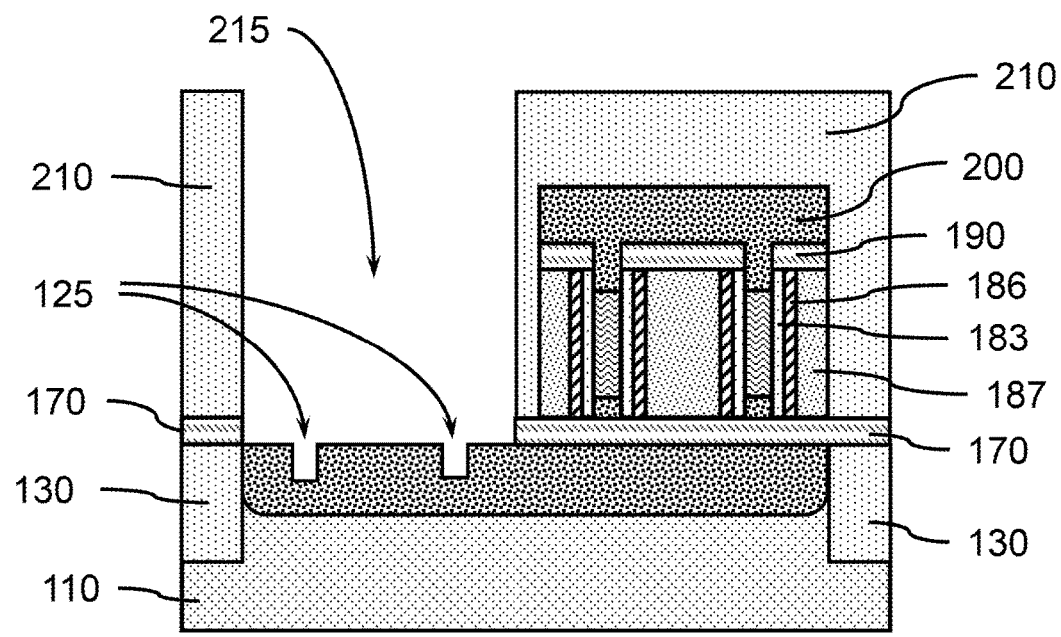
FIG. 15 is a cross-sectional side view of the trench formed in the interlayer dielectric and recesses formed in the doped region, in accordance with an exemplary embodiment.

In one or more embodiments, a work function layer 186 may be formed between the gate dielectric layer 183 and the gate fill layer 187, as shown in FIG. 15. A work function layer may be deposited over the gate dielectric layer 183. The work function layer 186 may form part of a part of a gate electrode of a gate structure, where the gate structure may be on at least a portion of a vertical fin 141.

In various embodiments, a work function layer 186 may be formed on the gate dielectric layer 183 by a blanket deposition, for example, CVD, and etched back.

In various embodiments, the work function layer 186 may be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), titanium aluminum carbide (TiAlC), titanium aluminum carbide (TiAlC), tantalum carbide (TaC), hafnium carbide (HfC), and combinations thereof.

In various embodiments, the work function layer 186 may have a thickness in the range of about 3 nm to about 11 nm, or may have a thickness in the range of about 5 nm to about 8 nm.

In one or more embodiments, a portion of the first gate fill layer 187, first gate dielectric layer 183, and/or first work function layer 186 may be removed to reduce the height of the first gate fill layer 187, first gate dielectric layer 183, and/or first work function layer 186. In various embodiments, the first gate fill layer 187, first gate dielectric layer 183, and/or first work function layer 186 may be removed by a chemical-mechanical polishing (CMP).

In one or more embodiments, the heights of the gate fill layer 187, gate dielectric layer 183, and/or work function layer 186 may be reduced to below the top surface(s) of the vertical fin(s) 141. The heights of the gate fill layer 187, gate dielectric layer 183, and/or work function layer 186 may be reduced by an amount sufficient to provide space for the formation of a top spacer on the gate structure(s), while leaving a portion of the vertical fin(s) 141 exposed for formation of a top source/drain.

In various embodiments, the top spacers 190 may be, for example, silicon oxide (SiO), silicon nitride (SiN), silicon boron carbonitride (SiBCN), silicon oxycarbide (SiOC), etc. In one or more embodiments, the top spacer layer 190 may have a thickness in the range of about 3 nm to about 25 nm, or in the range of about 5 nm to about 20 nm. The top spacer layer 190 may provide electrical isolation of a gate structure from a top source/drain. The top spacer 190 may be the same or a different material than the bottom spacer 170.

Figure 6:
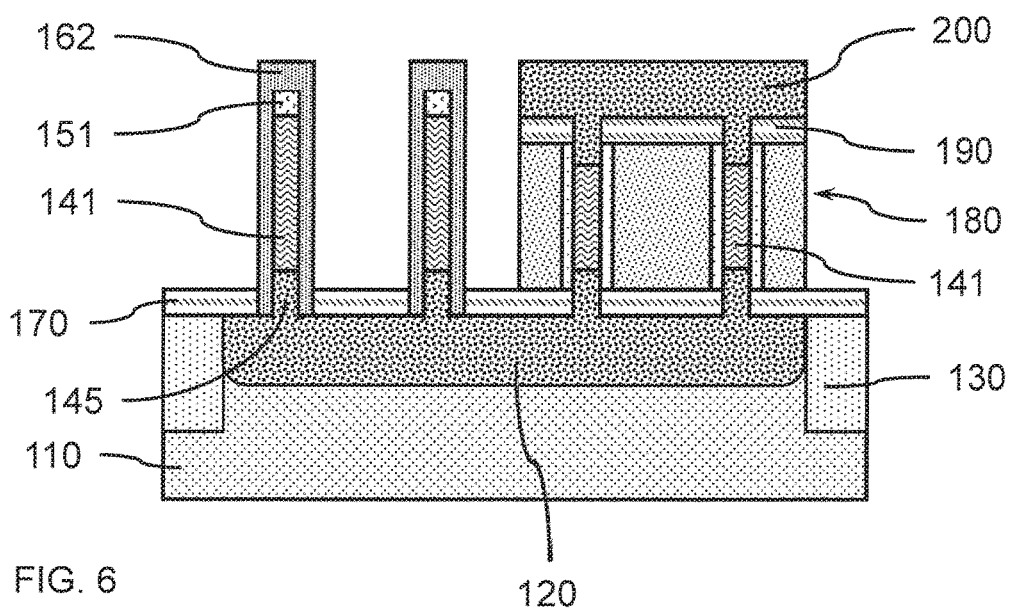
FIG. 6 is a cross-sectional side view of a top source/drain formed on a gate structure and plurality of vertical fins, in accordance with an exemplary embodiment.

FIG. 6 is a cross-sectional side view of a top source/drain formed on a gate structure and plurality of vertical fins, in accordance with an exemplary embodiment.

In one or more embodiments, a top source/drain 200 may be formed on the top surface of the vertical fin(s) 141. The top source/drain(s) 200 may be formed by epitaxially growth on the exposed surfaces of the vertical fin(s) 141, where the top source/drains 200 may have the same crystal structure and orientation as the vertical fin(s) 141.

In one or more embodiments, a top source/drain 200 may be silicon or silicon-germanium, where the silicon or silicon-germanium is crystalline. In various embodiments, the top source/drain(s) 200 may be doped in-situ or ex-situ, where the doping may be p-type doping or n-type doping to form an n-type vertical FET (NFET) or a p-type vertical FET (PFET). The channel may be suitably doped to affect the carrier concentrations and to form an n-type vertical finFET or a p-type vertical finFET in relation to the top source/drains 200 and doped region(s) 120 forming bottom source/drain(s) of the vertical finFETs.

In various embodiments, the top source/drain 200 may be the same material as or different from the vertical fin 141 on which the top source/drain 200 is formed. In various embodiments, a source and drain may be interchanged, where the doped regions 120 can form a drain and the epitaxially formed doped material at the top of the vertical fin 141 may be the source.

In one or more embodiments, the vertical fin(s) 141 may be heat treated to diffuse dopant(s) from the doped region 120 into at least a lower portion 144 of the vertical fin(s) adjacent to and in contact with the doped region. The n-type or p-type dopant(s) may migrate from the doped region 120 a predetermined distance into the lower portion 144 of the vertical fin(s) 141 proximal to the doped region to form a doped extension 145, as shown in FIG. 5. The bottom spacer(s) may act as diffusion barriers to prevent dopants from migrating into the gate structures. The extension(s) 145 may be electrically coupled with the underlying doped region 120.

In one or more embodiments, a portion of the dopants in the top source/drain 200 may diffuse into at least an upper portion of the vertical fin(s) 141 adjacent to and in contact with the top source/drain 200 due to the heat treatment.

In one or more embodiments, the heat treatment to diffuse the dopant(s) may be at a temperature in the range of about 800° C. to about 1200° C., or in the range of about 1000° C. to about 1200° C., or in the range of about 900° C. to about 1100° C. In various embodiments, the heat treatment may be conducted for a period of time in the range of about 1 millisecond to about 60 minutes, or in the range of about 30 seconds to about 30 minutes, or in the range of about 1 millisecond to about 10 seconds, or in the range of about 10 minutes to about 60 minutes. The heat treatment may be an annealing process, where the heat treatment may be conducted in an annealing furnace, by rapid thermal annealing (RTA), or by laser annealing, where the process may be selected based on the temperature and duration of the heat treatment.

Figure 7:
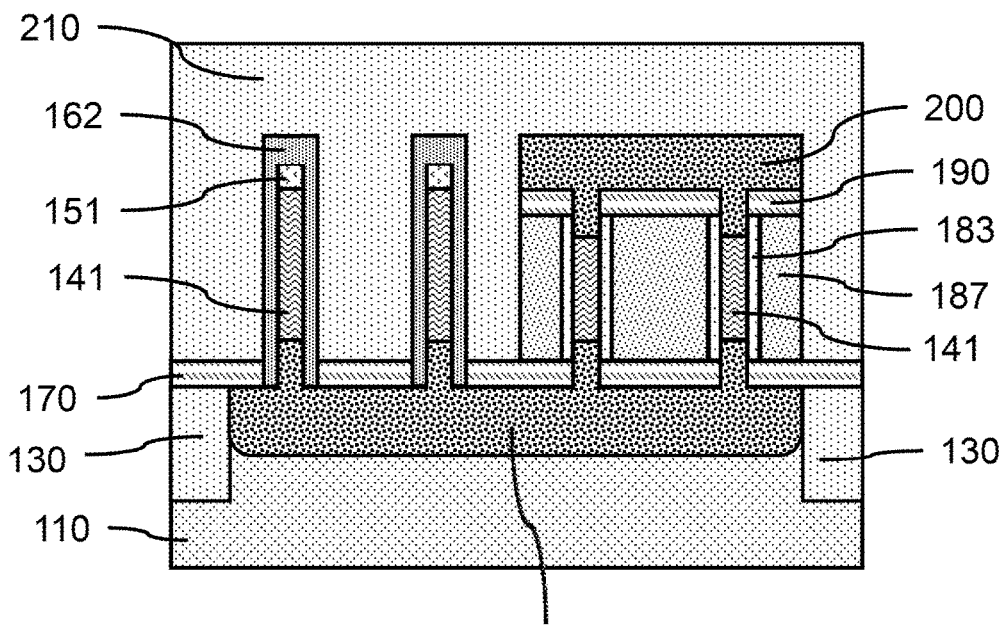
FIG. 7 is a cross-sectional side view of an interlayer dielectric on a gate structure and top source/drain, in accordance with an exemplary embodiment.

FIG. 7 is a cross-sectional side view of an interlayer dielectric on a gate structure and top source/drain, in accordance with an exemplary embodiment.

In one or more embodiments, an interlayer dielectric 210 may be formed on the hardmask cover 162, bottom spacers 170, top spacer(s) 190, and the top source/drain 200, where the interlayer dielectric 210 may be blanket deposited on the exposed surfaces. The height of the interlayer dielectric 210 may then be reduced, for example, by CMP.

In various embodiments, the interlayer dielectric 210 may be, for example, silicon oxide (SiO), silicon nitride (SiN), silicon boron carbonitride (SiBCN), silicon oxycarbide (SiOC), etc. The interlayer dielectric 210 may be the same or different material as the top spacer(s) 190. In one or more embodiments, an interlayer dielectric 210 may be a low-K dielectric material, for example, fluorine doped SiO, carbon doped SiO, porous SiO, or combinations thereof. The interlayer dielectric 210 may be an insulating material that electrically insulates electrical contacts formed to the gate structures, and/or source drains.

Figure 8:
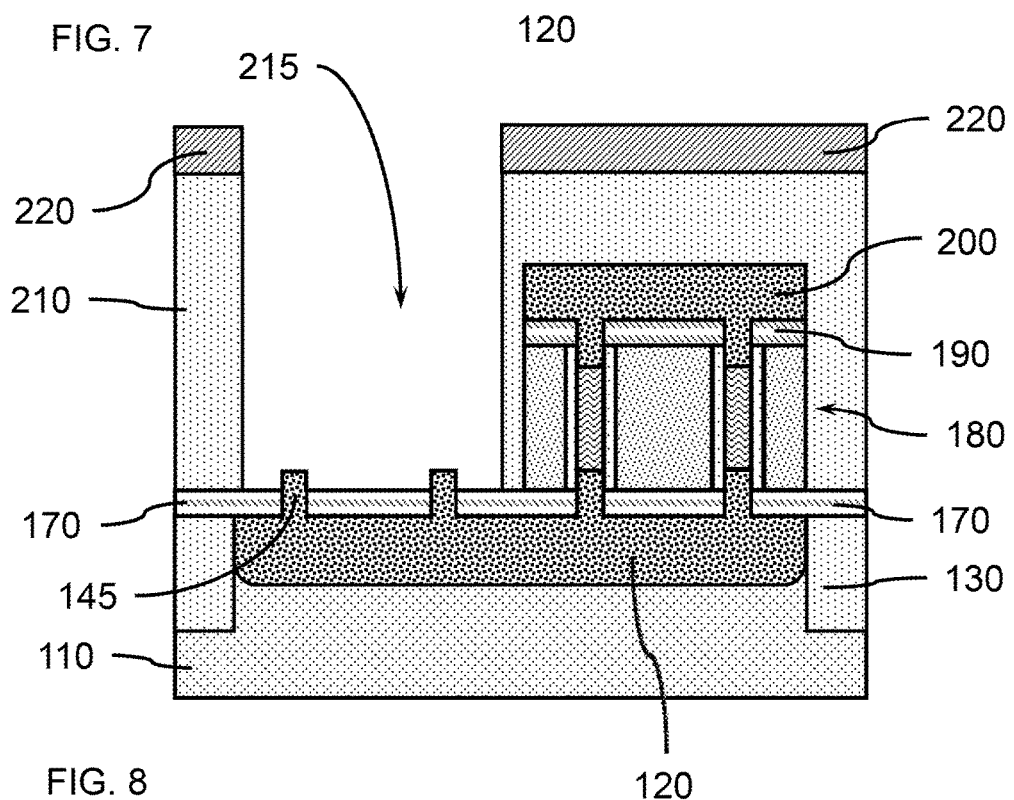
FIG. 8 is a cross-sectional side view of a contact mask formed and patterned on the interlayer dielectric and a trench in the interlayer dielectric, in accordance with an exemplary embodiment.

FIG. 8 is a cross-sectional side view of a contact mask formed and patterned on the interlayer dielectric and a trench in the interlayer dielectric, in accordance with an exemplary embodiment.

In one or more embodiments, a contact mask 220 (e.g., resist) may be formed on the interlayer dielectric 210, patterned and developed to expose portions of the interlayer dielectric. The exposed portions of the interlayer dielectric 210 may be removed, for example, by a direction etch (e.g., RIE) to form trenches 215 in the interlayer dielectric 210. The trenches 215 may be located in regions that expose one or more vertical fin(s) 141. The hardmask cover 162 on each of the vertical fins may protect the vertical fin(s) during removal of the interlayer dielectric and formation of the trench(es) 215.

In various embodiments, the contact mask 220 may be a photoresist formed by spin on coating followed by lithography, or a hard mask that can be patterned by lithography. In various embodiments, the contact mask 220 may include two or more layers, including a hard mask layer and a soft mask (i.e., photoresist) layer that can be patterned and developed as known in the art.

In one or more embodiments, the one or more vertical fin(s) 141 exposed by formation of the trench(es) 215 may be removed, as dummy fin(s), where the hardmask cover 162 and the vertical fin(s) 141 may be removed by one or more wet or dry etching processes. The bottom spacer 170 may act as an etch stop, and may protect the doped region 120 during removal of the vertical fin(s), where the bottom spacer 170 may be a different material than the hardmask cover 162.

In one or more embodiments, a doped extension 145 may remain after removal of the one or more vertical fin(s) 141, where the doped extension 145 extends above the surface of the doped region, and may extend above the top surface of the bottom spacer 170. The etch of the vertical fin(s) may selectively leave the doped extension 145 behind. The etch may be a timed etch that removes a predetermined portion of the one or more vertical fin(s) 141.

In various embodiments, the height of the extension(s) 145 measured from the top surface of the doped region 120 to the top surface of the extension, may be in the range of about 10 nm to about 40 nm.

Figure 9:
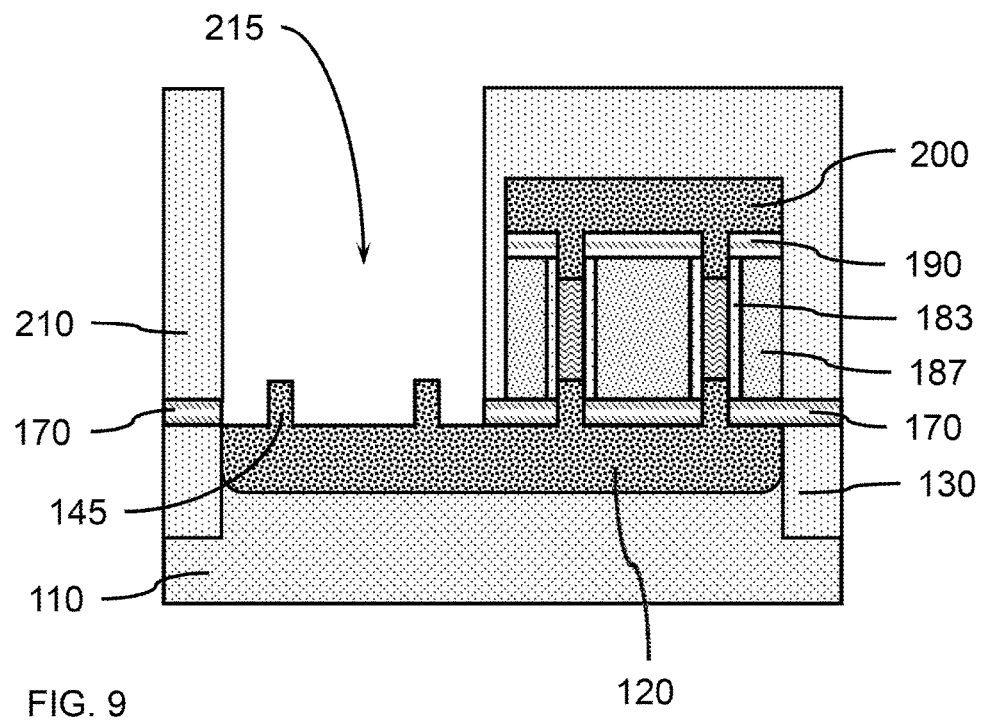
FIG. 9 is a cross-sectional side view of the trench formed in the interlayer dielectric after removal of the contact mask and bottom spacer, in accordance with an exemplary embodiment.

FIG. 9 is a cross-sectional side view of the trench formed in the interlayer dielectric after removal of the contact mask and bottom spacer, in accordance with an exemplary embodiment.

In one or more embodiments, the bottom spacer 170 exposed by the trench 215 may be removed by a selective etch, for example, a wet etch, that exposes the doped region 120 and the protruding doped extensions 145.

In one or more embodiments, the contact mask 220 may be removed to expose the interlayer dielectric, where the contact mask 220 and the bottom spacer 170 may be the same material that may be removed by the same wet etch. In various embodiments, the contact mask 220 and the bottom spacer 170 may be different materials that may be selectively removed by separate etching processes. If the contact mask 220 is a resist, the contact mask may be removed by ashing or stripping, as would be known in the art.

Figure 10:
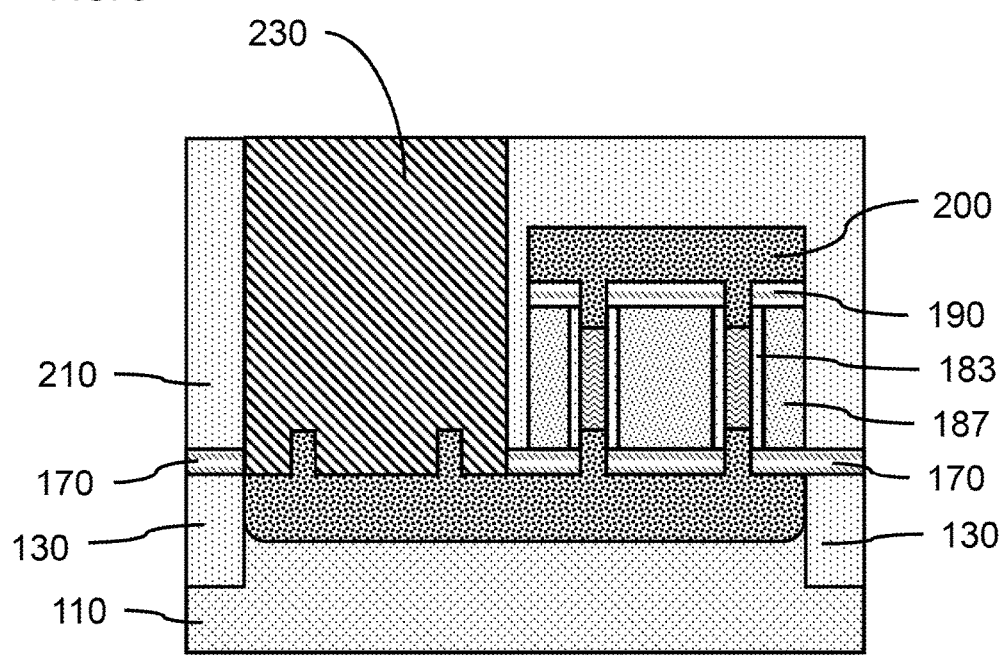
FIG. 10 is a cross-sectional side view of the trench formed in the interlayer dielectric filled with a source/drain contact, in accordance with an exemplary embodiment.

FIG. 10 is a cross-sectional side view of the trench formed in the interlayer dielectric filled with a source/drain contact, in accordance with an exemplary embodiment.

In one or more embodiments, a conductive material may be formed in the trench 215 to form a bottom source/drain contact 230 on at least a portion of the doped region 120. The bottom source/drain contact 230 may be in contact with the doped region 120 and the protruding doped extensions 145 to form an electrical connection therebetween. The protruding doped extensions 145 may provide increased contact surface area between the bottom source/drain contact 230 and the doped region forming a bottom source/drain, where the interfacial area is greater than if the bottom source/drain contact 230 was formed on a flat surface of the doped region 120 having the same length and width.

In various embodiments, the bottom source/drain contact 230 may be a conductive material (e.g., tungsten. copper, titanium, aluminum, or combinations thereof).

Figure 11:
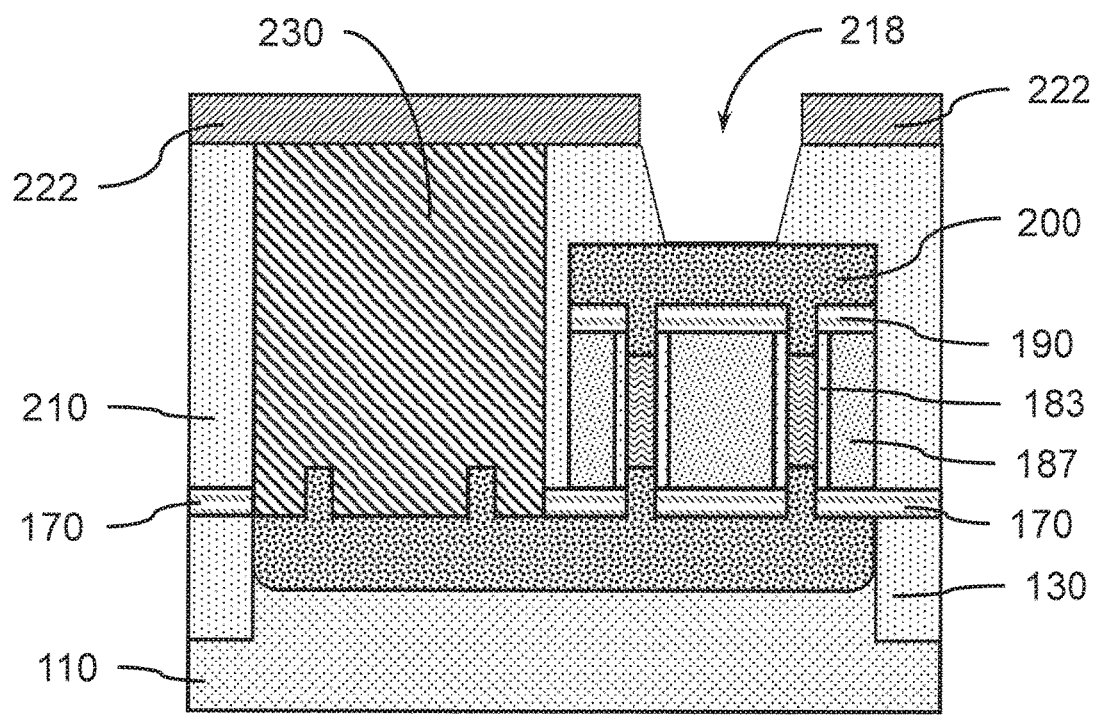
FIG. 11 is a cross-sectional side view of an electrical contact via formed in the interlayer dielectric to the top source/drain, in accordance with an exemplary embodiment.

FIG. 11 is a cross-sectional side view of an electrical contact via formed in the interlayer dielectric to the top source/drain, in accordance with an exemplary embodiment.

In one or more embodiments, interconnect vias 218 may be formed in the interlayer dielectric 210, where the interconnect vias 218 may be formed by forming and patterning a photo mask 222 (e.g., resist) to expose at least a portion of the interlayer dielectric 210. The exposed portion of the interlayer dielectric 210 may be removed by etching to form the interconnect via 218. The interconnect vias 218 may extend through the interlayer dielectric 210 to the top source/drain 200.

Figure 12:
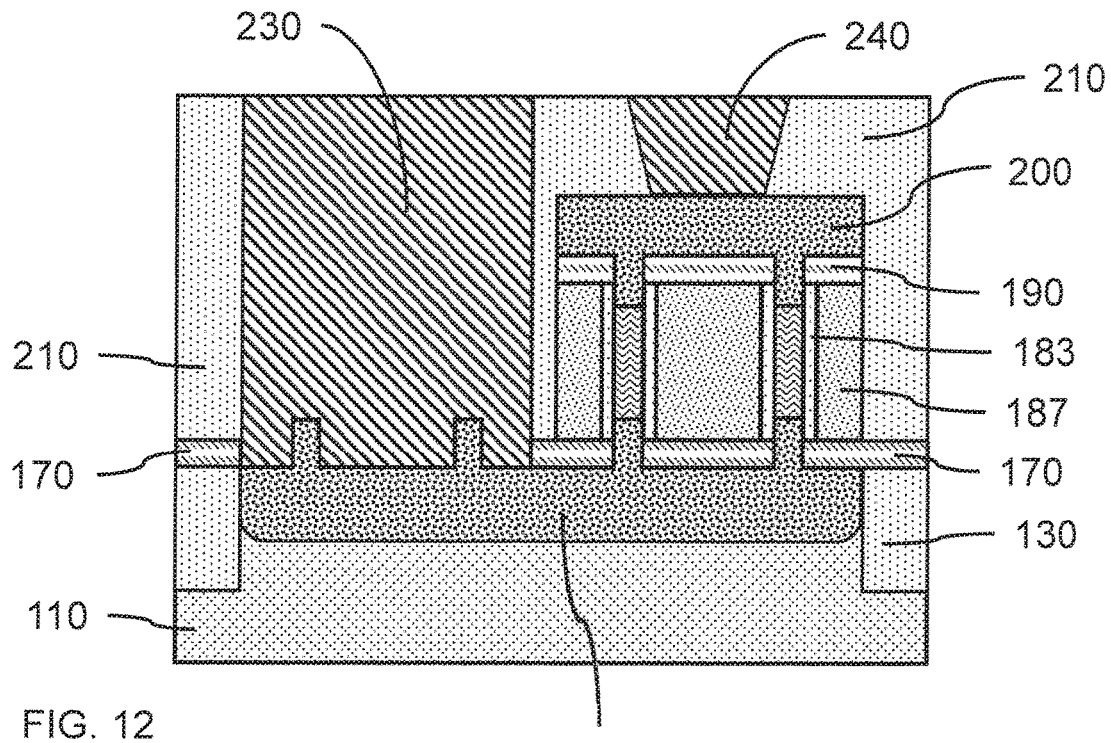
FIG. 12 is a cross-sectional side view of a top source/drain contact formed in the interlayer dielectric to the top source/drain, in accordance with an exemplary embodiment.

FIG. 12 is a cross-sectional side view of a top source/drain contact formed in the interlayer dielectric to the top source/drain, in accordance with an exemplary embodiment.

In one or more embodiments, the interconnect vias 218 may be filled with a conductive material (e.g., tungsten. copper, titanium, molybdenum, aluminum, or combinations thereof) to form a top source/drain contact 240, where the top source/drain contact 240 forms an electrical connection with the top source/drain 200. While the figure shows the top source/drain contact 240 having a particular size and configuration, this is for illustrative purposes only, and should not be considered a limitation. The top source/drain contact 240 may be configured to be as large as and/or in full contact with 100% of the surface area of the top source/drain 200.

In various embodiments, the photo mask 222 may be removed before or after forming the top source/drain contact 240, where the photo mask 222 may be an organic layer that can be removed by processes known in the art (e.g., stripping, ashing, etc.).

Figure 13:
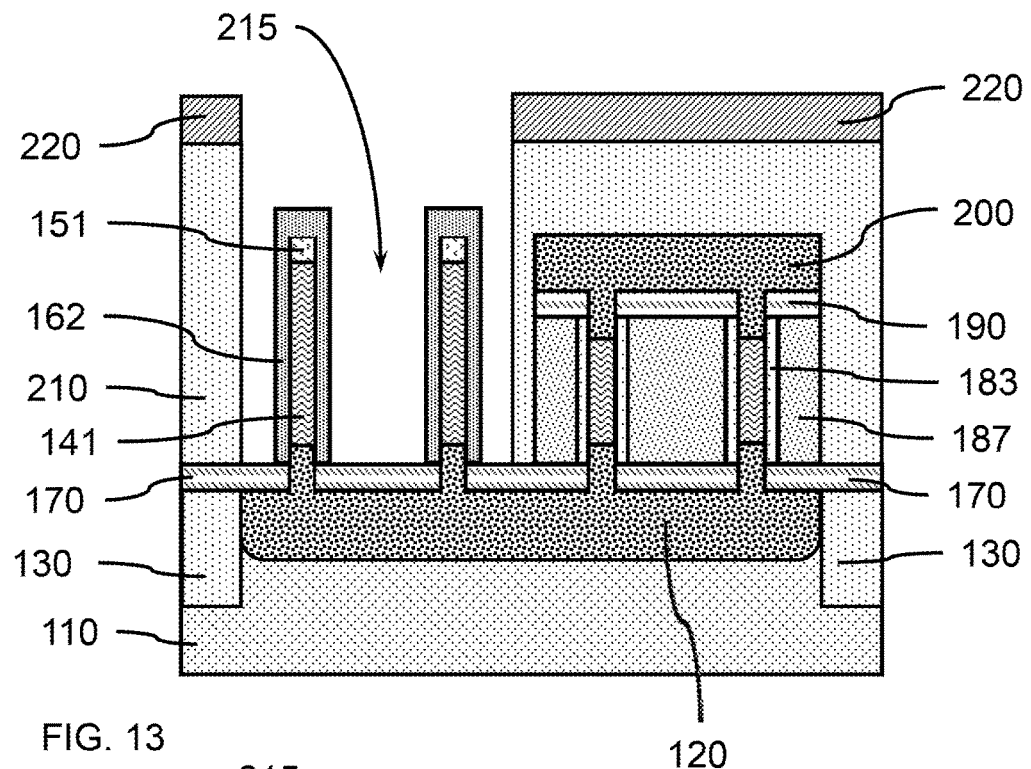
FIG. 13 is a cross-sectional side view of the trench formed in the interlayer dielectric exposing two vertical fins and bottom spacer, in accordance with an exemplary embodiment.

FIG. 13 is a cross-sectional side view of the trench formed in the interlayer dielectric exposing two vertical fins and bottom spacer, in accordance with an exemplary embodiment.

The features illustrated in FIG. 13 may be another embodiment after forming the features discussed for FIG. 1-7.

In one or more embodiments, a contact mask 220 may be formed on the interlayer dielectric 210, patterned and developed to expose portions of the interlayer dielectric.

In one or more embodiments, the exposed portions of the interlayer dielectric 210 may be removed, for example, by a direction etch (e.g., RIE) to form trenches 215 in the interlayer dielectric 210. The trenches 215 may be located in regions that expose one or more vertical fin(s) 141, where the exposed vertical fin(s) may have been predetermined to be dummy fins. The hardmask section 161 and the optional hardmask cover 162 on each of the vertical fins may protect the vertical fin(s) during removal of the interlayer dielectric and formation of the trench(es) 215.

In one or more embodiments, the one or more vertical fin(s) exposed by formation of the trench(es) 215 may be removed, where the hardmask cover 162 and/or hardmask section 161, and the vertical fin(s) 141 may be removed by one or more wet or dry etching processes. The bottom spacer 170 may act as an etch stop, and may protect the doped region 120 during removal of the vertical fin(s), where the bottom spacer 170 may be a different material than the hardmask cover 162 and/or hardmask section 161.

Figure 14:
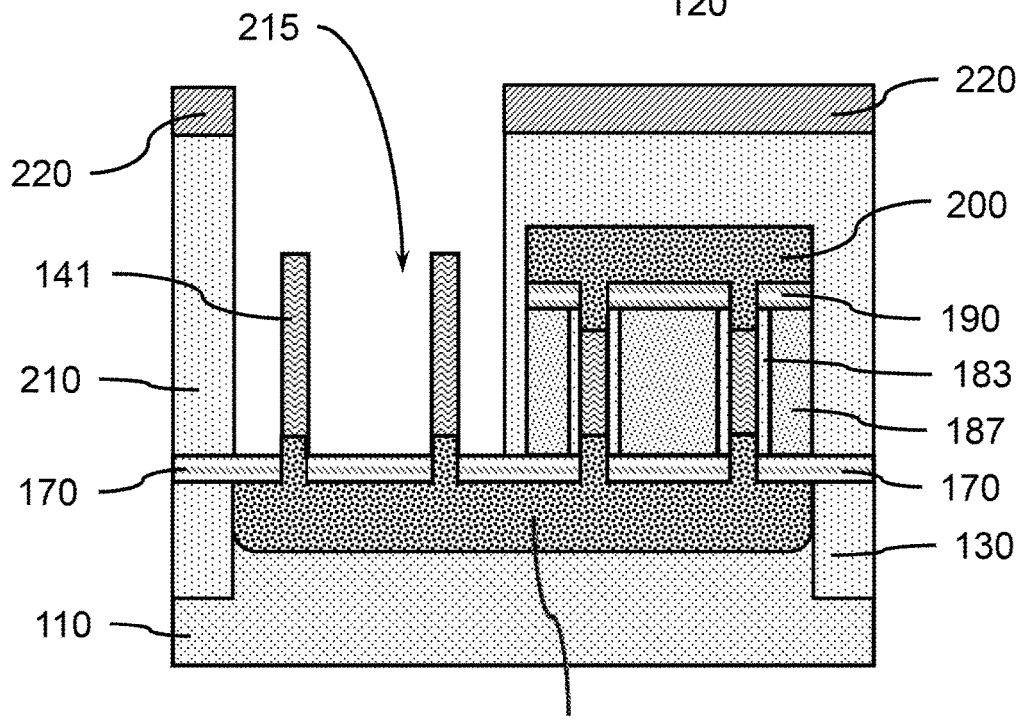
FIG. 14 is a cross-sectional side view of the trench formed in the interlayer dielectric and two vertical fins after removal of the hardmask cover, in accordance with an exemplary embodiment.

FIG. 14 is a cross-sectional side view of the trench formed in the interlayer dielectric and two vertical fins after removal of the hardmask cover, in accordance with an exemplary embodiment.

In one or more embodiments, the hardmask cover 162 may be selectively removed to expose the liner section 151 and vertical fins 141. The liner segment 151 may be removed by a selective etch to leave the exposed vertical fin(s) 141.

FIG. 15 is a cross-sectional side view of the trench formed in the interlayer dielectric and recesses formed in the doped region, in accordance with an exemplary embodiment.

In one or more embodiments, the exposed vertical fin(s) 141 may be removed to expose the doped extension(s) 145. The doped extension(s) 145 may be removed to expose portions of the doped region 120 in the openings of the bottom spacer 170. A directional etch (e.g., RIE) may be used to form recesses 125 in the doped region 120, where the extension and a portion of the doped region beneath the extension are removed to form the recess(es) 125. The bottom spacer 170 may act as a mask for formation of the recesses 125. The recess can be formed by etching (e.g., by RIE) the doped region 120 forming a bottom source/drain, where the RIE process is selective to the extension/doped region material, so that recesses 125 are selectively formed in the doped region(s) 120. The etch may be a timed etch that removes a predetermined portion of the doped region 120 to form the one or more recesses 125.

In various embodiments, one or more vertical fins 141 may be partially removed to form one or more extensions 145 jutting out from the surface of the doped region 120, where each extension 145 has sidewalls and endwalls that provide additional interfacial area with a source/drain contact compared to a flat surface of a source/drain.

In various embodiments, one or more vertical fins 141 may be completely removed and portions of the doped region 120 also removed to form one or more recesses 125 into the bottom source/drain surface, where each recess has sidewalls and endwalls that provide additional interfacial area with a source/drain contact 230 compared to a flat surface of a source/drain. In various embodiments, the one or more recesses 125 do not extend all the way through the doped region 120 to the substrate 110.

In various embodiments, the vertical fins 141 may have a width in the range of about 6 nm to about 20 nm, and a length in the range of about 100 nm to about 1000 nm. The extensions and recesses may have the same width and length. In various embodiments, the recess depth may be substantially greater than the fin width. For example, the recess depth measured from the top surface of the doped region 120 to the bottom of the recess, may be in the range of about 10 nm to about 40 nm.

In various embodiments, the contact area between the bottom source/drain contact 230 and the doped region 120 forming the bottom source/drain may increase by about 2 times the extension height or recess depth, which would translate to a bottom source/drain contact-doped region interface with about 20 nm to 80 nm more contact length if the interface was flat. Forming the interfacial features, thereby reduces the contact length that would otherwise be needed to create the same interfacial area, and thereby increases the density of devices that may be formed on a substrate.

Figure 16:
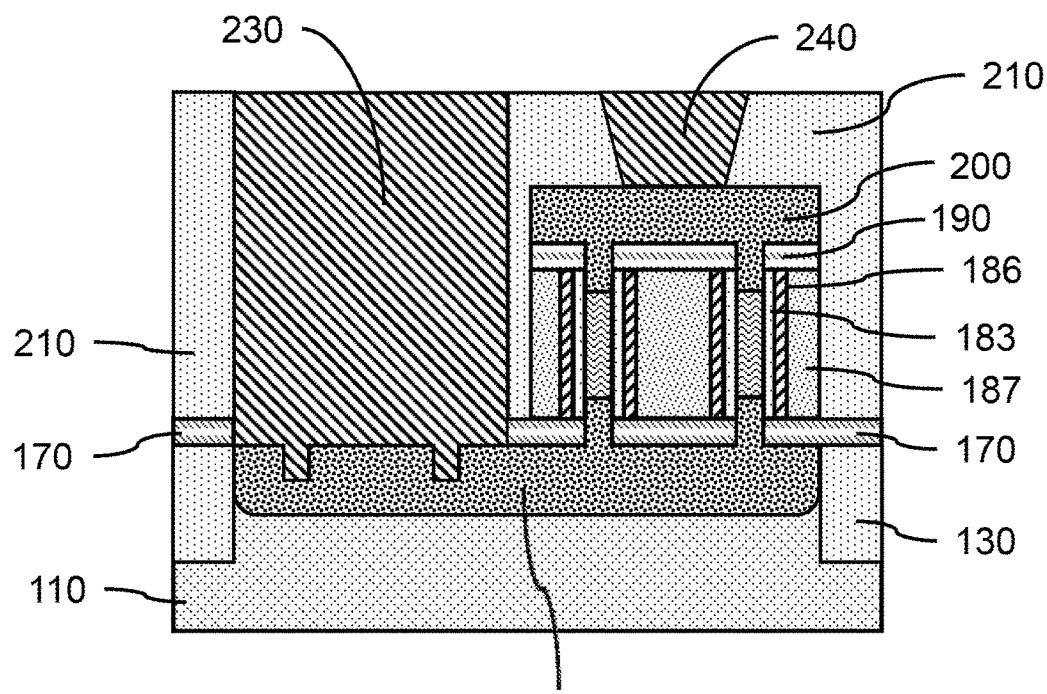
FIG. 16 is a cross-sectional side view of a top source/drain contact formed in the interlayer dielectric to the top source/drain and a bottom source/drain contact formed in the interlayer dielectric to the bottom source/drain, in accordance with an exemplary embodiment.

FIG. 16 is a cross-sectional side view of a top source/drain contact formed in the interlayer dielectric to the top source/drain and a bottom source/drain contact formed in the interlayer dielectric to the bottom source/drain, in accordance with an exemplary embodiment.

In one or more embodiments, the top source/drain contact 240 may be formed in the interlayer dielectric 210, where the top source/drain contact may be a conductive material (e.g., tungsten. copper, titanium, molybdenum, aluminum, or combinations thereof). The top source/drain contact 240 may form an electrical connection with the top source/drain 200.

The bottom source/drain contact 230 may be formed in contact with the doped region 120 and fill the recess(es) 125 in the doped region 120 to form an electrical connection therebetween. The recesses 125 may provide increased contact surface area between the bottom source/drain contact 230 and the doped region 120 forming a bottom source/drain, where the interfacial area is greater than if the bottom source/drain contact 230 was formed on a flat surface of the doped region 120 with the same length and width.

In one or more embodiments, the doped region 120 has one or more interfacial features that increases the surface area of the interface between the bottom source/drain contact 230 and the doped region 120 compared to a flat bottom source/drain contact-doped region interface. The interfacial features may be 3-dimensional interfacial features that may be one or more extensions 145 or one or more recesses 125, where the 3-dimensional interfacial features may include endwalls and sidewalls. The 3-dimensional interfacial features may increase the surface area between the bottom source/drain contact 230 and the doped region 120 to provide increased electrical contact area and decreased contact resistance.

Figure 17:
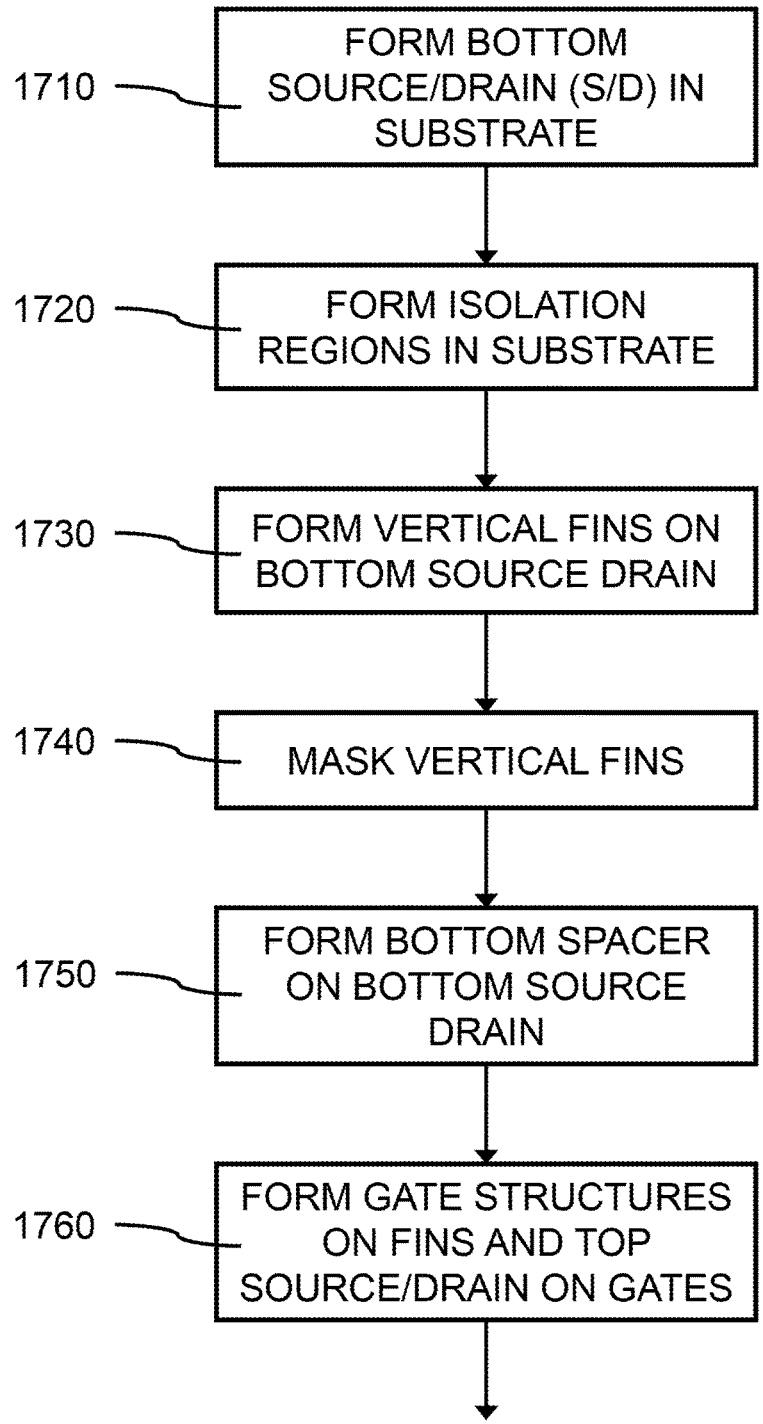
FIG. 17 is a block/flow diagram showing a method of forming a vertical finFET with reduced contact resistance to a bottom source/drain, in accordance with an exemplary embodiment.

FIG. 17 is a block/flow diagram showing a method of forming a vertical finFET with reduced contact resistance to a bottom source/drain, in accordance with an exemplary embodiment.

In block 1710, a bottom source drain may be formed in at least a portion of a substrate, where the bottom source/drain may be a doped region formed in the substrate and the dopant(s) are activated. The bottom source drain may be formed by doping techniques, including but not limited to, ion implantation, thermal diffusion, gas phase doping, plasma doping, plasma immersion ion implantation, cluster doping, infusion doping, liquid phase doping, solid phase doping, or combinations thereof. In various embodiments, the doped region 120 (i.e., source/drain region) may be n-doped or p-doped to form an NFET or a PFET. The dopants may be implanted into the substrate to a predetermined depth.

In block 1720, one or more isolation regions may be formed in the substrate, where the isolation regions may be adjacent to the bottom source/drain to electrically isolate bottom source/drain regions of different finFETs. An isolation region may extend into the substrate below the depth of the bottom source/drain and be filled with a dielectric material to form a shallow trench isolation region.

In block 1730, one or more vertical fins may be formed on the substrate, where the vertical fins may be on and electrically coupled to the bottom source/drain. A fin layer may be formed on the substrate surface, where the fin layer may be a crystalline layer epitaxially grown on the substrate.

In various embodiments, a sidewall image transfer (SIT) technique may be used to form one or more vertical fins on the substrate. In a typical SIT process, spacers are formed on the sidewall of a sacrificial mandrel. The sacrificial mandrel is removed and the remaining upright spacers are used to pattern hardmask fin template(s). The hardmask fin template(s) are used as a mask during the etch of the top semiconductor layer to form one or more vertical fins. The upright spacers are then removed after the semiconductor vertical fins have been formed. In various embodiments, the substrate may be a single crystal Si substrate and the vertical fins may be single crystal silicon.

In one or more embodiments, the vertical fins may have the same composition and crystal structure as the substrate. In various embodiments, the vertical fins may have a different chemical composition, but essentially the same crystal structure as the substrate, for example, where a silicon germanium (SiGe) or silicon carbide (SiC) fin is epitaxially grown on a silicon single crystal substrate, or a gallium arsenide (GaAs) fin is grown on a germanium (Ge) substrate, for example, by molecular beam heteroepitaxy.

In block 1740, a hardmask cover may be formed over each of the one or more vertical fins to protect the fins during subsequent processing steps. The hardmask cover may be a silicon nitride (SiN) or a silicon oxynitride (SiON). The hardmask cover may be optional.

In block 1750, a bottom spacer may be formed on the exposed portions of the bottom source/drain, isolation region(s), and/or substrate between the vertical fin(s). The bottom spacer may be formed by CVD or gas cluster ion beam (GCIB) deposition. Portions of the bottom spacer deposited on the sidewalls of the vertical fins may be removed.

In block 1760, a gate structure may be formed on each of the one or more vertical fin(s), and a top spacer may be formed on each of the gate structures.

A gate structure may be formed by depositing a gate dielectric layer on the vertical fins that will form an active device, and a gate electrode on the gate dielectric layer, where the gate electrode may include a work function layer and a gate fill layer. A work function layer may be deposited on the gate dielectric layer before deposition of the gate fill layer. Portions of the gate dielectric layer, work function layer, and gate fill layer may be removed to form a gate structure of a predetermined size on the vertical fin(s).

Figure 18:
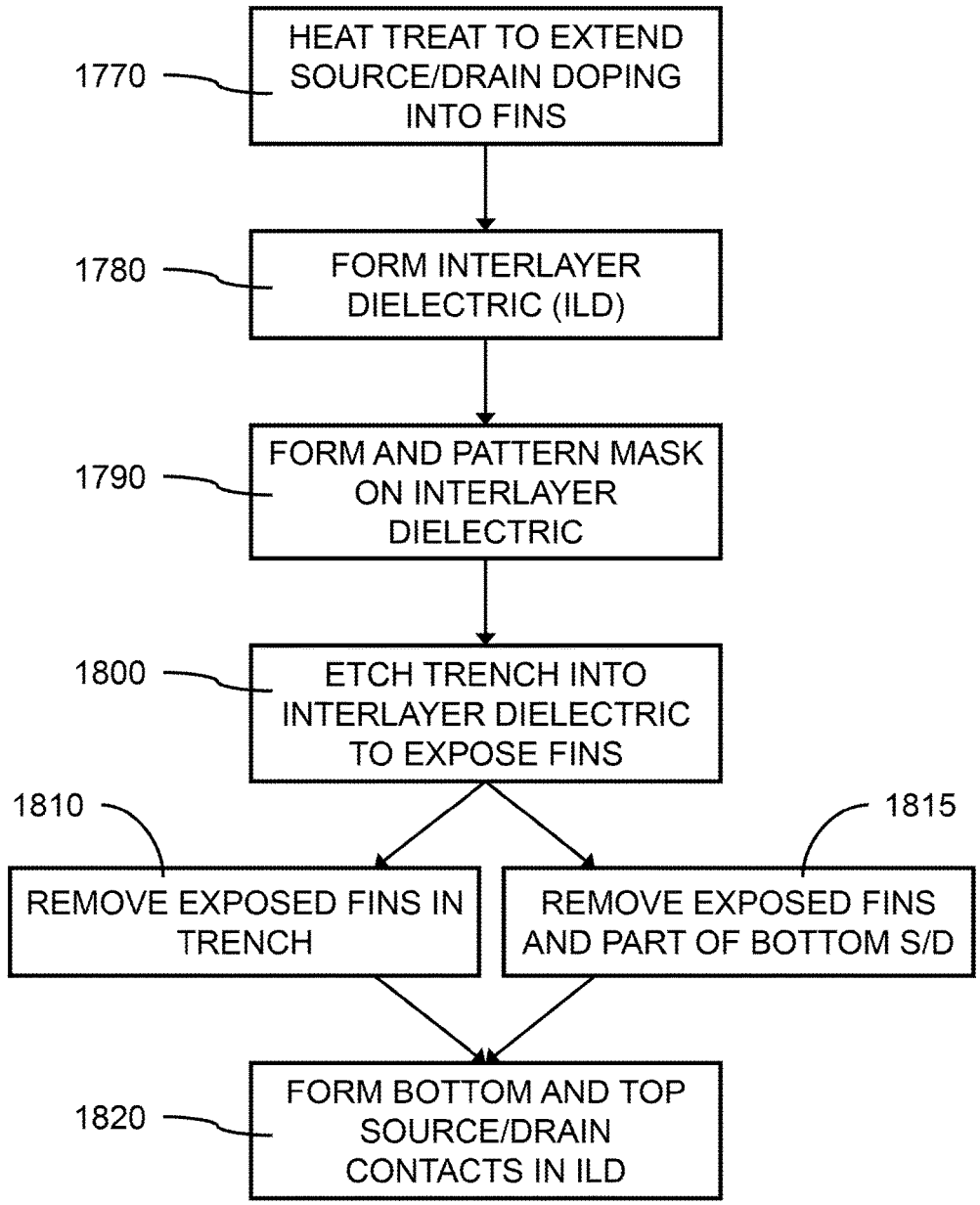
FIG. 18 is a continuation of the block/flow diagram showing a method of forming a vertical finFET with reduced contact resistance to a bottom source/drain in FIG. 17, in accordance with an exemplary embodiment.

FIG. 18 is a continuation of the block/flow diagram showing a method of forming a vertical finFET with reduced contact resistance to a bottom source/drain starting in FIG. 17, in accordance with an exemplary embodiment.

In block 1770, the vertical fins and bottom source/drain may be heat treated to allow the dopant(s) in the bottom source/drain to diffuse into the portion of the vertical fins in contact with the bottom source/drain.

The heat treatment to diffuse the dopant(s) may be at a temperature in the range of about 800° C. to about 1200° C., or in the range of about 1000° C. to about 1200° C., or in the range of about 900° C. to about 1100° C.

In various embodiments, the heat treatment may be conducted for a period of time in the range of about 1 millisecond to about 60 minutes, or in the range of about 30 seconds to about 30 minutes, or in the range of about 1 millisecond to about 10 seconds, or in the range of about 10 minutes to about 60 minutes.

In block 1780, an interlayer dielectric may be formed on the vertical fins and gate structures.

An interlayer dielectric may be formed over the vertical fin(s) and gate structure(s) on the substrate, where the interlayer dielectric may be a low-K dielectric material.

In FIG. 1790, the interlayer dielectric may be masked and the mask layer patterned to expose portions of the interlayer dielectric. The mask layer may be a photoresist material, which may be a positive or negative resist.

In block 1800, the portions of the interlayer dielectric exposed through the mask layer may be removed to form one or more trenches, where the trenches expose one or more vertical fin(s), and the bottom spacers may be exposed at the bottom of the trenches. The exposed vertical fin(s) may be dummy fins that will be removed to form a bottom source/drain contact.

In block 1810, the upper portions of the exposed vertical fin(s) may be removed to expose the doped, lower portions of the fin(s). The etch may be a timed etch that removes a predetermined portion of the one or more vertical fin(s), where the etch may be a dry plasma etch (e.g., RIE). The etching rate may vary for the doped, lower portions of the fin(s) compared to the undoped, upper portion of the fin(s), where the different etching rates may allow controlled removal of a portion of the fin(s).

In block 1815, the upper portions of the exposed vertical fin(s) and the doped lower portions of the fin(s) may be removed to form recesses into the bottom source/drain (S/D). The etch may be a timed etch that removes a predetermined portion of the bottom source/drain to form the one or more recesses, where the etch may be a dry plasma etch (e.g., RIE). The bottom spacers may act as a mask for etching the recesses.

The bottom spacers may be removed after formation of the extensions or recesses, where the bottom spacers may be selectively etched.

In block 1820, interconnect vias may be formed in the interlayer dielectric, and the vias and trenches filled with a conducting material (e.g., metal) to form bottom source/drain contacts and top source/drain contacts. The contact masks may be removed before or after formation of the bottom source/drain contacts and top source/drain contacts.

The extension(s) may extend from the surface of the bottom source/drain into the bottom source/drain contact, or the bottom source/drain contacts may extend into the recesses that extend into the surface of the bottom source/drain. The interface with the doped extensions or recesses between the bottom source/drain contact and the bottom source/drain may have a contact resistance that is less than if the bottom source/drain had a flat surface without the extension and/or recess features at the interface.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical fin field effect transistor (vertical fmFET) with a reduced source/drain contact resistance, comprising:
    forming one or more doped regions in a substrate;
    forming a plurality of vertical fins on at least one of the one or more doped regions;
    heat treating the one or more doped regions in the substrate and the plurality of vertical fins on the at least one of the one or more doped regions to diffuse dopant from the doped region in contact with the plurality of vertical fins into a lower portion of each of the plurality of vertical fins;
    removing an upper portion of at least one of the plurality of vertical fins, wherein the lower portion of the at least one of the plurality of vertical fins remains as an extension on the at least one of the one or more doped regions; and
    forming a bottom source/drain contact on the extension and the at least one of the one or more doped regions.

2. The method of claim 1, wherein the heat treating is at a temperature in the range of about 800° C. to about 1200° C.

3. The method of claim 1, wherein the extension has a height in the range of about 10 nm to about 40 nm measured from an upper surface of the doped region.

4. The method of claim 1, wherein the extension is electrically coupled with the at least one of the one or more doped regions, and increases the interfacial surface area between the bottom source/drain contact and the at least one of the one or more doped region.

5. The method of claim 1, wherein the dopant concentration in the one or more doped regions is in the range of about $1 \times 10^{19}$ cm$^{-3}$ to about $2 \times 10^{21}$ cm$^{-3}$.

6. The method of claim 1, wherein the plurality of vertical fins are made of a material selected from the group consisting of silicon (Si), germanium (Ge), silicon germanium (SiGe), silicon carbide (SiC), III-V compound semiconductor materials, and II-VI compound semiconductor materials.

7. The method of claim 1, further comprising forming a gate structure on at least one of the plurality of vertical fins on the at least one of the one or more doped regions, and leaving at least one of the plurality of vertical fins on the at least one of the one or more doped regions without a gate structure.

8. The method of claim 7, further comprising forming an interlayer dielectric on the at least one of the one or more vertical fins with the gate structure and the at least one of the one or more vertical fins without the gate structure; and removing a portion of the interlayer dielectric on the at least one of the one or more vertical fins without the gate structure to expose the vertical fin(s) without the gate structure.

\* \* \* \* \*